United States Patent [19]

Honda et al.

[11] Patent Number: 5,285,122

[45] Date of Patent: Feb. 8, 1994

[54] VARIABLE DELAY DEVICE

[75] Inventors: Fumiaki Honda, Takatsuki; Nobukazu Hosoya, Nara, both of Japan

[73] Assignee: Sanyo Electric Co., Ltd., Moriguchi, Japan

[21] Appl. No.: 904,689

[22] Filed: Jun. 26, 1992

[30] Foreign Application Priority Data

Jun. 28, 1991 [JP] Japan .................. 3-158983

[51] Int. Cl.⁵ .............................................. H03K 5/15
[52] U.S. Cl. ..................................... 307/603; 307/602
[58] Field of Search ............... 307/590, 591, 595, 602, 307/603

[56] References Cited

U.S. PATENT DOCUMENTS

| | | | |
|---|---|---|---|
| 4,041,533 | 8/1977 | Yamamoto et al. | 307/591 |
| 4,737,670 | 4/1988 | Chan | 307/595 |
| 5,144,174 | 9/1992 | Murakami | 307/595 |
| 5,196,736 | 3/1993 | Doornhein et al. | 307/595 |

FOREIGN PATENT DOCUMENTS 0239696 10/1987 European Pat. Off. .

OTHER PUBLICATIONS

Patent Abstracts of Japan vol. 12, No. 293 (E-645) Aug. 10, 1988 & JP-A-63 069 314 (Sony) Mar. 29, 1988 * abstract*.

*Primary Examiner*—John S. Heyman
*Assistant Examiner*—Shawn Riley
*Attorney, Agent, or Firm*—Armstrong, Westerman, Hattori, McLeland & Naughton

[57] ABSTRACT

A variable delay device includes a variable delay circuit (12) and a correction circuit (14). On the basis of output signals R and V from variable delay lines (30, 32) of the correction circuit, an output signal $V_L$ by which a control characteristic of a variable delay line (16) is made substantially linear is outputted to the variable delay circuit from a linearity detector (34) of the correction circuit. The output signals R and V are also applied to a variable range detector (36), and on the basis of an output of the detector (36), an output signal $V_r$ by which a variable range of the variable delay line (16) is made constant is outputted to the variable delay circuit (12) from a reference level generator (38) of the correction circuit. The output signal $V_L$ determines an input/output characteristic of a non-linear circuit (22) which is included in the variable delay circuit and modifies a variable amount control signal $V_d$, and the output signal $V_r$ is added to an output signal of the non-linear circuit by an adder (24) included in the variable delay circuit, and an adder result is applied to the variable delay line (16) as a control signal therefor.

3 Claims, 5 Drawing Sheets

F I G. 1
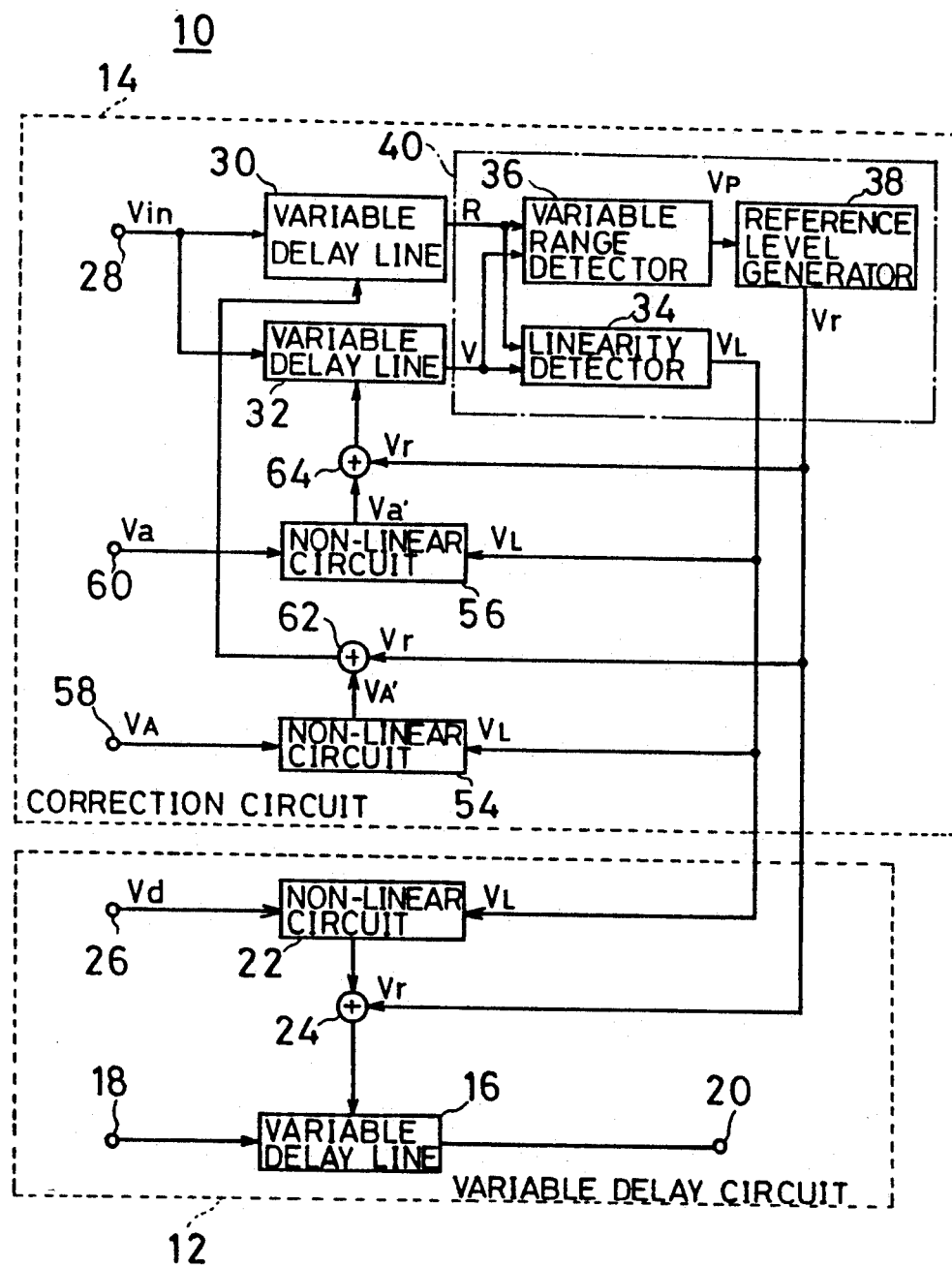

VARIABLE DELAY DEVICE

BACKGROUND OF THE INVENTION

1. Field of the invention

The present invention relates to a variable delay device. More specifically, the present invention relates to a variable delay device which is utilized as an analog IC delay line.

2. Description of the prior art

Up to now, there is a variable delay device which is constructed by using a C-MOS inverter. The C-MOS inverter has a transfer delay time of approximately few nanoseconds for each stage, and therefore, if the number of stages of the C-MOS inverter is increased, it is possible to obtain a delay time equal to the number of stages. The delay time of the C-MOS inverter can be adjusted by a driving voltage which is applied to the C-MOS inverter. In general, a control characteristic representative of a relationship between the driving voltage and the delay time becomes a non-linear characteristic as shown in FIG. 6.

In such a variable delay device, it becomes difficult to properly control the C-MOS inverter because the control characteristic largely varies due to dispersions or variations of temperature, circuit components and etc. Accordingly, there was a problem that a characteristic of the variable delay device does not become stable.

SUMMARY OF THE INVENTION

Therefore, a principal object of the present invention is to provide a variable delay device with a stable characteristic.

The present invention is a variable delay device comprising: a variable delay circuit including a first variable delay line which is constructed by utilizing a C-MOS inverter and delays an input signal and outputs a delayed signal; and a correction circuit which applies first and a second output for respectively controlling a linearity and a variable range of a control characteristic of the first variable delay line.

On the basis of the output of the second and the third variable delay lines included in the correction circuit, the first output by which the control characteristic of the first variable delay line is made substantially linear is applied to the first non-linear circuit from the linearity detecting means. An input/output characteristic of the first non-linear circuit is changed by the first output, and then, an output obtained by modifying the first control signal which is applied to the first non-linear circuit is fed to the first adder. On the basis of the outputs from the second and the third variable delay lines, the second output by which the variable range of the first variable delay line is made constant is applied to the first adder from the reference level generating means. The output of the first non-linear circuit and the second output are added to each other by the first adder and an added result is applied to the first variable delay line. Therefore, the linearity of the control characteristic of the first variable delay line and, thus, the control characteristic of the variable delay device becomes good and the variable range becomes constant.

According to the present invention, it is possible to make the linearity of the control characteristic of the variable delay device be good and to easily obtain the variable range being made be constant without dependent on a temperature and etc. by the first and second outputs from the correction circuit, respectively, and therefore, even if the variable delay device utilizes a C-MOS inverter, a stable characteristic and a constant variable range can be obtained.

The above described objects and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a block diagram showing one embodiment according to the present invention;

DETAILED DESCRIPTION OF THE PREFERRED EMBODIMENTS

Figure 2:
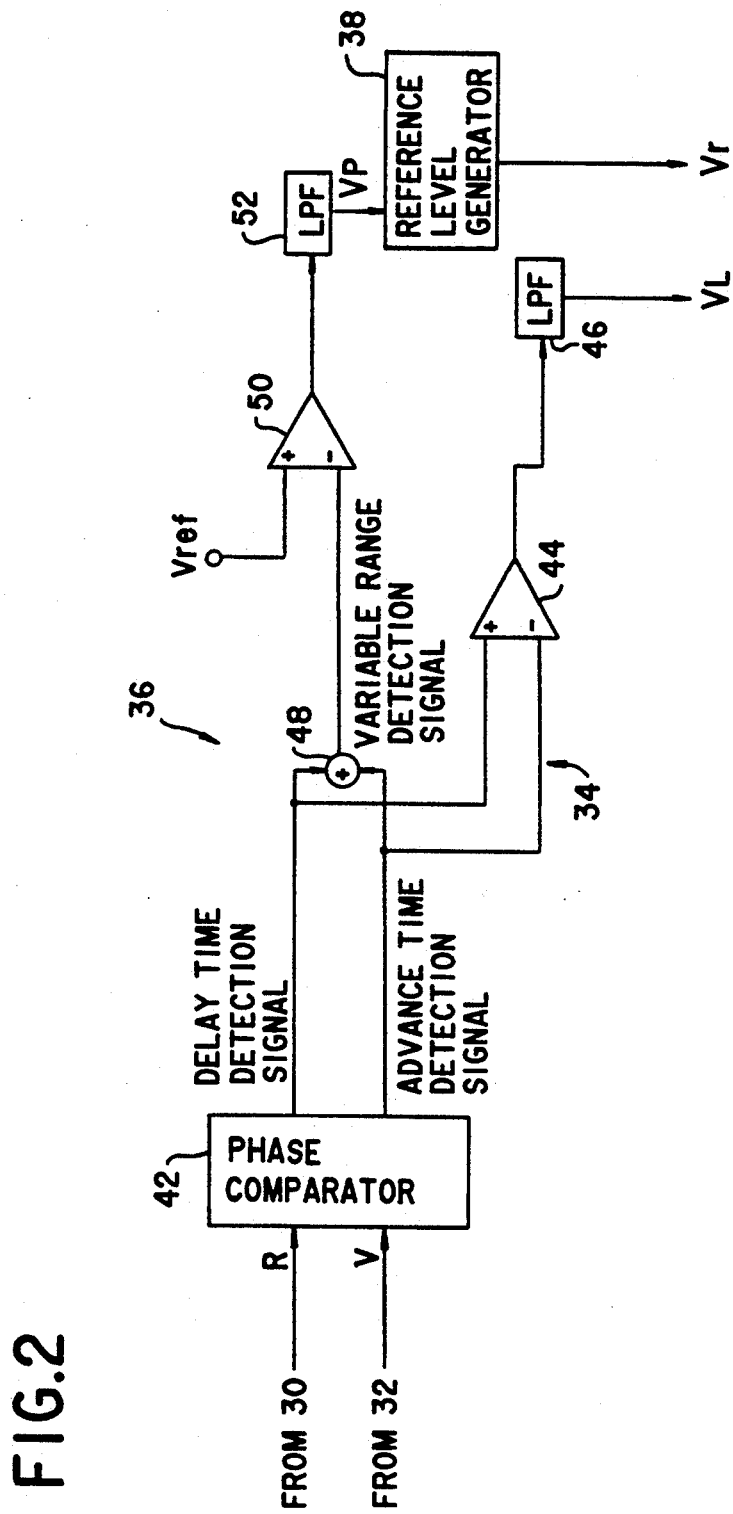
FIG. 2 is a circuit diagram showing examples of a linearity detector, variable range detector, and reference level detector utilized in FIG. 1 embodiment.

With reference to FIG. 1, a variable delay device 10 of this embodiment shown includes a variable delay circuit 12 and a correction circuit 14. The variable delay circuit 12 includes a variable delay line 16 utilizing a C-MOS inverter, and the variable delay line 16 delays an arbitrary signal inputted to a terminal 18 by a desired time and outputs the same at a terminal 20. A delay time of the variable delay line 16 is controlled by an output signal obtained by adding an output signal of a non-linear circuit 22 and an output signal $V_r$ from the correction circuit 14 by means of an adder 24, that is, by a driving voltage. To the non-linear circuit 22, a variable amount control signal $V_d$ from a terminal 26 and an output signal $V_L$ from the correction circuit 14 are applied. An amplitude of the control signal $V_d$ is equal to an amplitude of a control signal $V_a$ described later.

The correction circuit 14 includes variable delay lines 30 and 32 which commonly receive an input signal $V_{in}$ from a terminal 28. Each of the variable delay lines 30 and 32 utilizes a C-MOS inverter and has structure equal to structure of the variable delay line 16, and the variable delay lines 16, 30 and 32 have control characteristics shown in FIG. 6, respectively. An output signal R of the variable delay line 30 and an output signal V of the variable delay line 32 are inputted to a linearity detector 34 and a variable range detector 36, respectively. An error signal $V_p$ from the variable range detector 36 is outputted to a reference level generator 38. A portion surrounded by a one-dotted line 40 in FIG. 1 is constructed as shown in FIG. 2, for example. More specifically, in the linearity detector 34, the output signal R of the variable delay line 30 and the output signal V of the variable delay line 32 are phase-compared by a phase comparator 42, and thereafter, pulse widths of a delay time detection signal and an advance time detection signal both being thus obtained, are compared with each other by a comparator 44. Then, the linearity detector 34 outputs a signal according to the pulse widths as the output signal $V_L$ through a low-pass filter 46. In addition, in the variable range detector 36, the delay time detection signal and the advance time detection signal, obtained by phase-comparing of the output signals R and V by the phase comparator 42, are added to each other by an adder 48, and the variable range detector 36 inputs an added result to a comparator 50 as a variable range detection signal. Then, the variable range section signal is compared with a reference signal $V_{ref}$ having a predetermined variable range Td by a comparator 50, and an error signal thus obtained is outputted to the reference level generator 38 as the error signal $V_p$ through a low-pass filter 52. The reference level generator 38 converts the inputted error signal $V_p$ into the output signal $V_r$ having a proper direct current level and outputs the same.

Then, the output signal $V_L$ from the linearity detector 34 is inputted to each of the non-linear circuits 22, 54 and 56 so as to change an input/output characteristic thereof. Therefore, variable amount control signals $V_A$, and $V_a$ respectively outputted from terminals 58 and 60, are modified as output signals $V_A'$ and $V_a'$ by the non-linear circuits 54 and 56, and the output signals $V_A'$ and $V_a'$ are inputted to adders 62 and 64. Since the output signal $V_r$ from the reference level generator 38 is inputted to the adders 62 and 64, respectively, the adder 62 adds the output signal $V_A'$ and the error signal $V_r$ to each other and outputs an added result to the variable delay line 30, and the adder 64 adds the output signal $V_a'$ and the output signal $V_r$ to each other and outputs an added result to the variable delay line 32.

Figure 3:
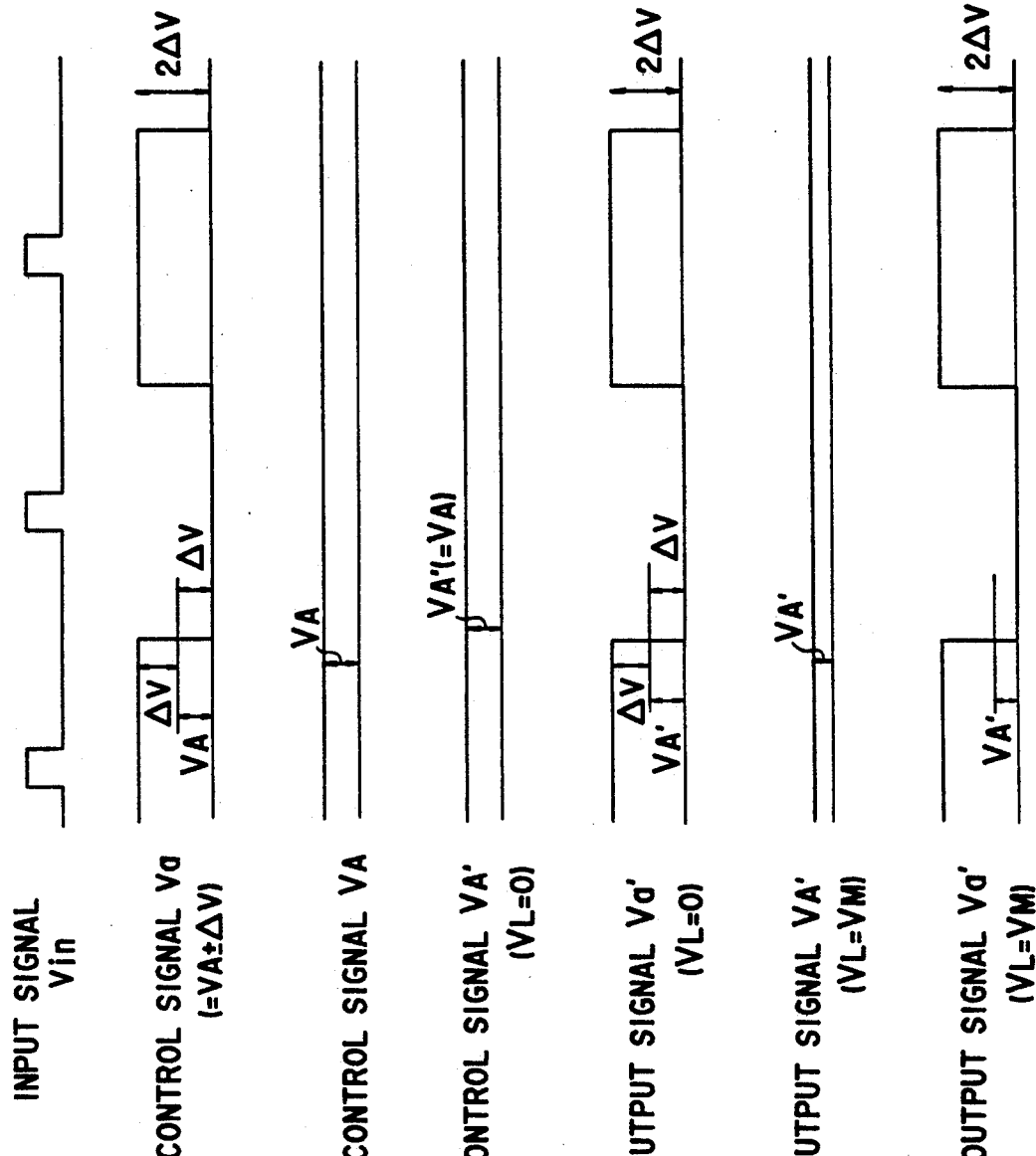
FIG. 3 is a waveform chart showing signals of respective portions of a correction circuit constituting FIG. 1 embodiment.

In operation, to the terminal 28 of the correction circuit 14, the input signal $V_{in}$ as shown in FIG. 3 is inputted, and the control signal $V_A$ and $V_a$ are inputted to the terminals 58 and 60, respectively. The input signal $V_{in}$, and the control signals $V_A$ and $V_a$ are signals for use in correction circuit 14. The control signals $V_A$ and $V_a$ have a relationship of $V_a = V_A \pm \Delta V$, and the control signal $V_a$ is a rectangular wave which vibrates with an amplitude of $\Delta V$ in symmetry with a center level of the control signal $V_A$. An average value of the control signal $V_a$ becomes the control signal $V_A$, and a magnitude of the $\Delta V$ can be decided in accordance with a variable range, that is, usage of the variable delay device 10.

Figure 4:
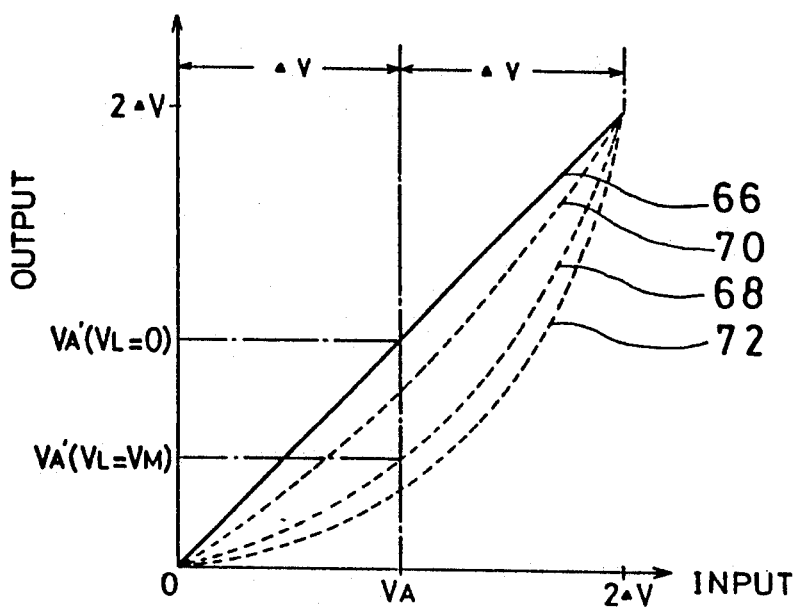
FIG. 4 is a graph showing an input/output characteristic of a non-linear circuit.

In an initial state, it is assumed that the output signal $V_L$, inputted to the non-linear circuits 22, 54 and 56 from linearity detector 36, is zero ($V_L=0$). Then, if each of the input/output characteristics of the non-linear circuits 22, 54 and 56 is shown in FIG. 4, in a case of $V_L=0$, the input/output characteristic can be shown by a proportional linear line 66 passing an origin. Therefore, the input signals $V_A$ and $V_a$ of the non-linear circuits 54 and 56 are outputted as the output signals $V_A'$ and $V_a'$ having the same magnitudes, and wave forms thereof are shown in FIG. 3. In addition, the input/output characteristic shown in FIG. 4 becomes a curved line which is gradually curved downward and largely as the output signal $V_L$ becomes larger. A case of $V_L = V_M$ is shown by a curved line 68, a case of $0 < V_L < V_M$ is shown by a curved line 70 between the linear line 66 and the curved line 68, and a case of $V_L > V_M$ is shown by a curved line 72 which is curved larger than the curved line 68, for example.

Figure 6:
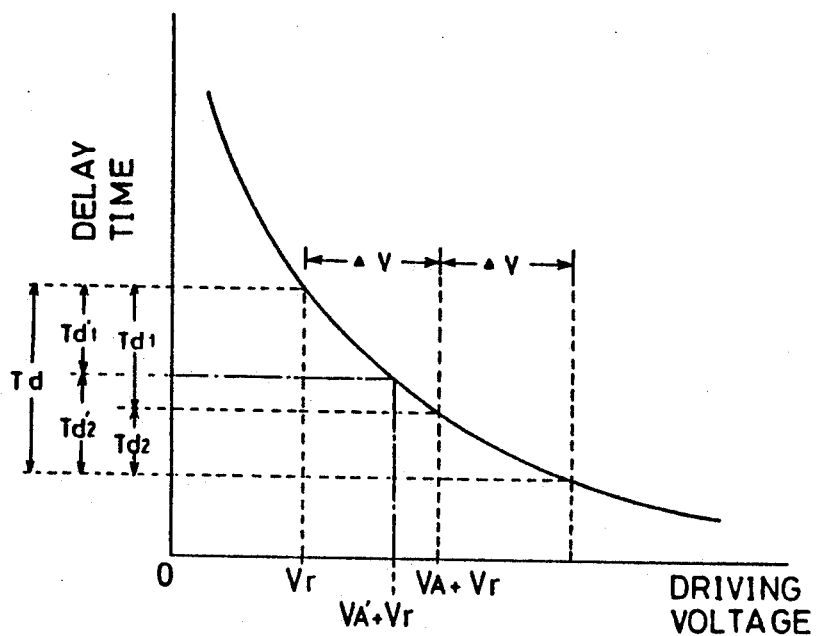
FIG. 6 is a graph showing a control characteristic of a variable delay line.
Figure 5:
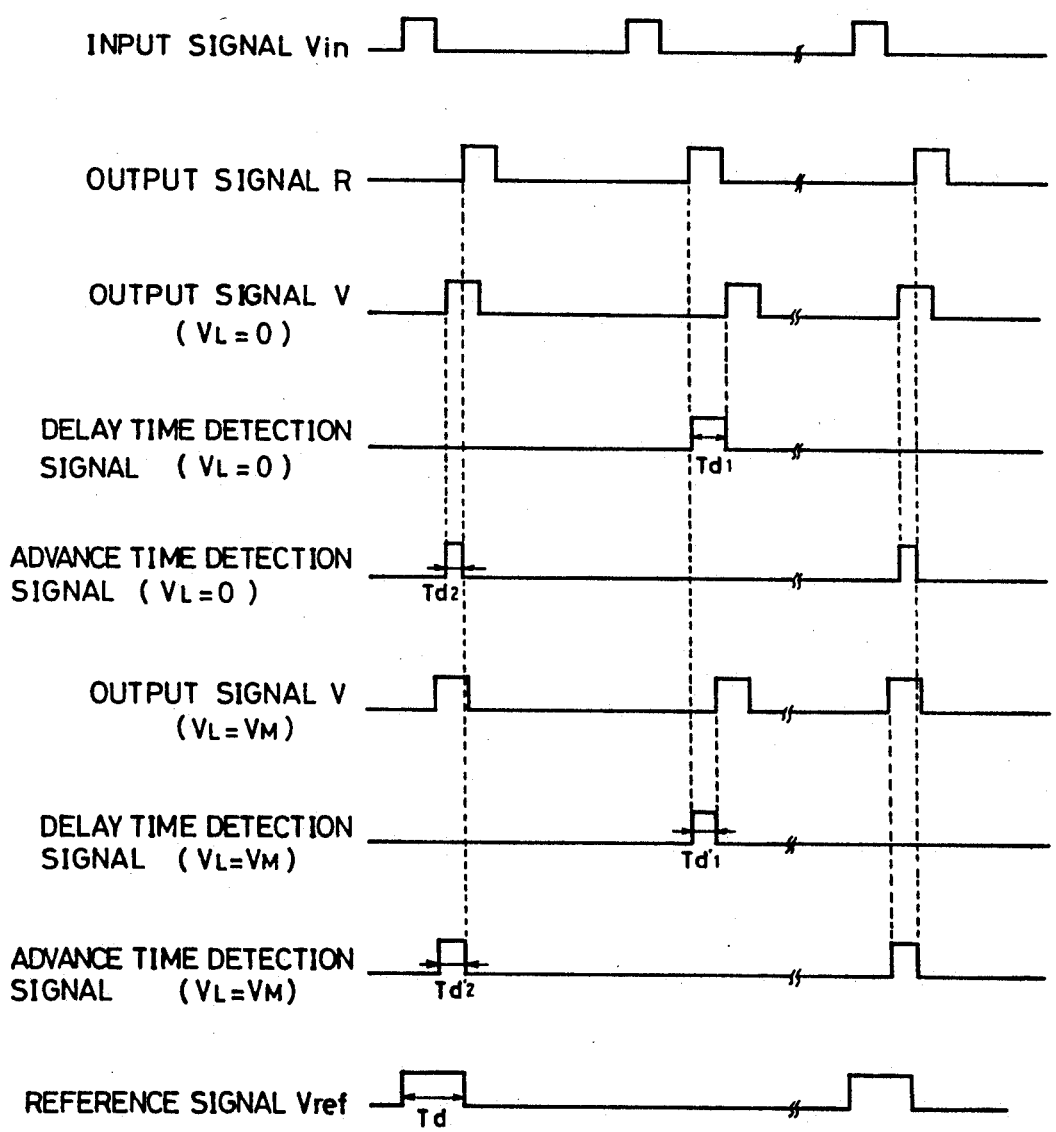
FIG. 5 is a waveform chart showing signal as of respective portions in the circuit diagram shown in FIG. 2.

Therefore, in a case of $V_L=0$, a driving voltage represented by a signal $(V_A' + V_r)$ is applied to the variable delay line 30 from the adder 62, and the delay time is determined by the control characteristic shown in FIG. 6, whereby the output signal R is outputted. In addition, to the variable delay line 32, a driving voltage represented by a signal $(V_a' + V_r)$ is applied. As seen from the above described relationship between the control signals $V_A$ and $V_a$, the driving voltage applied to the variable delay line 32 is a rectangular wave which vibrates with the amplitude of $\Delta V$ in symmetry with a center level of the driving voltage applied to the variable delay line 30. Therefore, a delay time of the output signal V from the variable delay line 32 is also determined by the control characteristic shown in FIG. 6. Therefore, as shown in FIG. 5, the output signal V from the variable delay line 32 is outputted so that a period when the phase is delayed and a period when the phase is advanced appear alternately with respect to the output signal R of the variable delay line 30. Then, the output signals R and V are inputted to the phase comparator 42, and a delay time Td1 and an advance time Td2 of the output signal V are detected by the phase comparator 42 with a reference of the output signal R, and therefore, the phase comparator 42 outputs the delay time detection signal and the advance time detection signal. The linearity and the variable range of the control characteristic can be detected by the delay time detection signal and the advance time detection signal.

Then, if the delay time detection signal and the advance time detection signal satisfy a condition of Td1 =Td2 it is determined that the control characteristic is substantially linear. In this embodiment shown, FIG. 2, the delay time detection signal and the advance time detection signal are inputted to the comparator 44 so as to detect a difference between the delay time Td1 and the advance time Td2, and the output of the comparator 44 is inputted to the non-linear circuits 22, 54 and 56 as the output signal $V_L$ after passing the low-pass filter 46. Therefore, the input/output characteristics of the non-linear circuits 22, 54 and 56 can be controller, the output signal $V_L$ becomes stable at a timing when Td1=Td2 is finally satisfied.

At this time, assuming that $V_L = V_M$ each of the input/output characteristics of the non-linear circuits 22, 54 and 56 is changed to the curved line 68 shown in FIG. 4. Therefore, the output signals $V_A'$ and $V_a'$ from the non-linear circuits 54 and 56 becomes as shown in FIG. 3, and therefore, the output signal $V_A'$ becomes smaller than the control signal $V_A$. As seen from a comparison of the output signals $V_A'$ and $V_a'$, the output signal $V_a'$ becomes a signal which largely swings toward a positive direction with respect to the output signal $V_A'$. Then, the output signal $V_a'$ and the output signal $V_r$ are added to each other by the adder 64, and the added result is supplied to the variable delay line 32 as the driving voltage thereof. The output signal $V_A'$ and the output signal $V_r$ are added to each other by the adder 62, and the added result is applied to the variable delay line 30 as the driving voltage thereof. Resultingly, with respect to the output signal R of the variable delay line 30, the output signal V of the variable delay line 32 becomes to have a relationship in phase as shown in FIG. 5. That is, in a case of $V_L = V_M$, in comparison with a case of $V_L=0$, an advance time of the advance time detection signal is increased and becomes an advance time Td'2, and a delay time of the delay time detection signal is decreased and becomes a delay time Td'1, and therefore, the both times becomes equal to each other (Td'1=Td'2). Accordingly, it is possible to obtain a control characteristic being substantially linear with respect to the control signal $V_a'$ inputted from the terminal 60.

Next, an operation for controlling the variable range of the variable delay circuit 12 will be described.

Because a total of the delay time and the advance time both detected by the phase comparator 42 shown in FIG. 2 becomes the variable range of the variable delay circuit 12, the total time is compared with a predetermined variable range Td of the reference signal $V_{ref}$ shown in FIG. 5 by the comparator 50. More specifically, by adding the delay time detection signal and the advance time detection signal to each other by the adder 48, a variable range detection signal is obtained, and the variable range detection signal and the reference signal $V_{ref}$ are compared with each other by the comparator 50 so as to obtain the error signal. The error signal is passed through the low-pass filter 52 and inputted to the reference level generator 38 as the error signal $V_p$. The error signal $V_p$ is converted into a proper direct current level by the reference level generator 38 and inputted to the adders 24, 62 and 64 as the output signal $V_r$. As shown in FIG. 6, since the variable range Td is decided by the driving voltage $V_{r-}v_r+2\Delta V$, in a case where the variable range of the variable range detection signal outputted from the adder 48 is larger than the variable range Td of the reference signal $V_{ref}$, the output signal $V_r$, outputted from the reference level generator 38, becomes larger. Inversely, if the variable range of the variable range detection signal is smaller than the variable range Td, the output signal $V_r$ becomes smaller. Finally, the output signal $V_r$ becomes stable at a timing when the variable range added by the adder 48 and the variable range Td of the reference signal $V_{ref}$ become equal to each other.

Thus, by controlling the variable delay circuit 12 by means of the output signal $V_L$ and the output signal $V_r$, with respect to the control signal $V_d$ of the variable delay circuit 12 being inputted from the terminal 26, the delay time is changed in a linear manner, and the variable range can be always defined by the predetermined range.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A variable delay device wherein:
   a variable delay circuit including a first variable delay line which is constructed by utilizing a c-MOS inverter and delays an input signal and outputs a delay signal; and
   a correction circuit which applies first and second outputs for respectively controlling a linearity and a variable range of a control characteristic of said first delay line; and
   said variable delay circuit includes a first non-linear circuit for modifying a first control signal according to said first output, and a first adder for adding an output of said first non-linear circuit and said second output to each other and applies a control signal to said first variable delay line.

2. A variable delay device according to claim 1, wherein said correction circuit includes first output generating means for generating said first output to cancel a non-linearity of said control characteristic, and second output generating means for generating said second output to control a range of a driving voltage which is applied to said C-MOS inverter.

3. A variable delay device according to claim 2, wherein said correction circuit includes a second and a third variable delay lines which have a common input and the same structure as that of said first variable delay line, respectively, linearity detecting means for detecting the linearity of the control characteristic on the basis of outputs of said second and said third variable delay lines to output said first output, variable range detecting means for detecting the variable range on the basis of the outputs of said second and said third variable delay lines, references level generating means for outputting said second output according to an output of said variable range detecting means, a second and a third non-linear circuits for modifying a second and a third control signals according to said first output, respectively, a second adder for adding an output of said second non-linear circuit and said second output to each other to apply a control signal to said second variable delay line, and a third adder for adding an output of said third non-linear circuit and said second output to apply a control signal to said third variable delay line.

* * * * *